(12) United States Patent
Fjelstad et al.

(10) Patent No.: US 6,573,609 B2
(45) Date of Patent: Jun. 3, 2003

(54) MICROELECTRONIC COMPONENT WITH RIGID INTERPOSER

(75) Inventors: Joseph Fjelstad, Maple Valley, WA (US); John Myers, Heilbronn (DE)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/771,412

(22) Filed: Jan. 26, 2001

(65) Prior Publication Data

US 2001/0048591 A1 Dec. 6, 2001

Related U.S. Application Data

(63) Continuation-in-part of application No. 09/413,410, filed on Oct. 6, 1999, now Pat. No. 6,208,025, which is a division of application No. 08/978,082, filed on Nov. 25, 1997, now Pat. No. 6,002,168.
(60) Provisional application No. 60/178,125, filed on Jan. 26, 2000.

(51) Int. Cl.[7] .................. H01L 29/40; H01L 23/48; H01R 12/00
(52) U.S. Cl. ............. 257/778; 257/696; 257/693; 257/780; 257/789; 439/66; 439/67; 439/77; 439/78
(58) Field of Search .................. 257/693, 696, 257/778, 780, 789, 686; 439/66, 67, 77, 78

(56) References Cited

U.S. PATENT DOCUMENTS

| | | |
|---|---|---|
| 3,303,393 A | 2/1967 | Hymes ................ 257/738 |
| 3,952,404 A | 4/1976 | Matunami ............. 29/589 |
| 4,893,172 A | 1/1990 | Matsumoto et al. ..... 257/669 |
| 5,067,007 A | 11/1991 | Kenji et al. ........... 257/696 |
| 5,148,265 A | 9/1992 | Khandros et al. ....... 257/773 |
| 5,148,266 A | 9/1992 | Khandros et al. ....... 257/773 |
| 5,152,695 A | 10/1992 | Grabbe et al. .......... 439/71 |
| 5,173,055 A | 12/1992 | Grabbe ................. 439/66 |
| 5,433,822 A | 7/1995 | Mimura et al. ......... 257/737 |
| 5,518,964 A | 5/1996 | DiStefano et al. ...... 438/113 |
| 5,659,952 A | 8/1997 | Kovac et al. .......... 257/668 |
| 5,763,939 A | 6/1998 | Yamashita ............. 257/668 |
| 5,763,941 A | 6/1998 | Fjelstad .............. 257/669 |
| 5,772,451 A | 6/1998 | Dozier et al. .......... 439/70 |
| 6,002,168 A | 12/1999 | Bellaar et al. ........ 257/696 |
| 6,353,255 B2 * | 3/2002 | Miyazaki et al. ....... 257/668 |

* cited by examiner

*Primary Examiner*—Jasmine J B Clark
(74) *Attorney, Agent, or Firm*—Lerner, David, Littenberg, Krumholz & Mentlik, LLP

(57) ABSTRACT

A connection component is provided. The connection component includes (1) a first interposer having a first surface to which a microelectronic may be mounted and a second surface opposite from the first surface, (2) a second interposer that is more flexible than the first interposer and that is disposed under the second surface of the rigid interposer, and (3) a plurality of conductive parts that may be positioned in the first and second interposers and that may be exposed at the first surface of the first interposer, a bottom surface of the second interposer, or both the first and bottom surfaces. The electrically conductive parts may include leads. A socket assembly or a microelectronic element such as semiconductor chip may be mounted onto the first surface of the rigid interposer. The connection component may be mounted onto a support substrate.

73 Claims, 6 Drawing Sheets

MICROELECTRONIC COMPONENT WITH RIGID INTERPOSER

CROSS REFERENCE TO RELATED APPLICATIONS

The present application is a continuation-in-part application of U.S. patent application Ser. No. 09/413,410, filed Oct. 6, 1999, U.S. Pat. No. 6,208,025 which in turn is a divisional application of U.S. patent application Ser. No. 08/978,082, filed Nov. 25, 1997 (now U.S. Pat. No. 6,002, 168), the disclosures of which are all hereby incorporated by reference herein. The present application claims benefit of U.S. Provisional Application 60/178,125 filed Jan. 26, 2000, the disclosure of which is incorporated by reference herein.

BACKGROUND OF THE INVENTION

1. Field of the Invention

The present invention relates to the art of electronic packaging, and more specifically to components useful for mounting and/or testing semiconductor chips and related electronic components. The present invention also relates to semiconductor chip assemblies and electronic devices incorporating such components.

2. Description of the Related Art

Modern electronic devices utilize semiconductor components, commonly referred to as "integrated circuits" which incorporate numerous electronic elements. These chips are mounted on substrates that physically support the chips and electrically interconnect each chip with other elements of the circuit. The substrate may be part of a discrete chip package, such as a single chip module or a multi-chip module, or may be a circuit board. The chip module or circuit board is typically incorporated into a large circuit. An interconnection between the chip and the chip module is commonly referred to as a "first level" assembly or chip interconnection. An interconnection between the chip module and a printed circuit board or card is commonly referred to as a "second level" interconnection. In "chip on board" packaging, the chip is mounted directly on the printed circuit board. This type of interconnection has been referred to as a "1½ level" interconnection.

One relatively common packaging scheme is called a "hybrid circuit". A hybrid circuit typically contains a semiconductor chip that has been mounted and electrically interconnected to a circuit that has been formed on a thin layer of a rigid ceramic material. The method used to electrically interconnected the chip to the circuit is generally any of the methods that are known for use in first level bonding, such as wire bonding, tab bonding and flip chip bonding. In some cases it is desirable to mount and electrically interconnect the hybrid circuit to a printed circuit board. Solder is typically used to form the interconnection. It is difficult, however, to rework a hybrid circuit that has been soldered to a printed circuit board. In order to rework the assembly, the hybrid circuit must be removed from the printed circuit board. When the hybrid circuit is separated from the printed circuit board, part of the solder mass is removed from the contacts on the hybrid circuit. Non-uniform partial solder masses remain on the hybrid circuit contacts, the printed circuit board or both. When the hybrid circuit is resoldered to the printed circuit board, the non-uniform partial solder masses can cause short circuits and alignment problems.

Another problem associated with the assembly process is testing. In a typical assembly process, each hybrid circuit is tested before it is soldered to a printed circuit board. Testing involves clamping the hybrid circuit to a socket to engage the solder balls of the hybrid circuit with the test contacts of the test assembly. When the solder balls are engaged with the test contacts, the solder tends to creep and to deform, especially if the hybrid circuit is equipped with high-lead solder. The testing process, like the rework process, can lead to short circuit and alignment problems. To overcome these problems, it is desirable to use solid core solder balls to interconnect the ceramic substrate to a printed circuit board.

In U.S. Pat. No. 3,303,393, which issued on Feb. 7, 1967, Hymes et al. disclose a semiconductor chip assembly with flip-chip connections, which incorporates copper core solder balls. One solid core solder ball is provided between each contact on the chip and each contact pad on the substrate. Although these connections work well for small devices, with larger devices, the rigid connections provided by the solid core solder balls tend to crack at the soldered junctions between the balls and the opposing surfaces. Warpage or distortion of the chip or substrate, furthermore, make it difficult to engage all of the solid core solder balls between the chip and substrate simultaneously, or to engage all of the solid core solder balls between the chip and a test fixture. Although it is desirable to use solid core solder balls to interconnect a hybrid circuit to a printed circuit board, such an interconnection would be subject to similar problems.

The electrical power that is dissipated when a microelectronic device is in operation tends to heat up that device. When the device is no longer in operation, it tends to cool down. Over a period of time, the device tends to undergo a number of heating up and cooling down cycles as the device is repeatedly turned on and off. These cycles, which cause an associated expansion and contraction of the device, are commonly referred to as "thermal cycling".

A device in which a hybrid circuit is bonded to a printed circuit board using solid core solder balls would be subject to substantial strain, caused by thermal cycling, during operation of the device. Electrical power dissipated within the hybrid circuit during operation would tend to heat up the hybrid circuit and, to a lesser extent, the printed circuit board. The temperature of the hybrid circuit, therefore, and, to a lesser extent, the printed circuit board would rise each time the device is turned on and fall each time the device is turned off. Since the hybrid circuit and the printed circuit board are normally constructed from different materials having different coefficients of thermal expansion, the hybrid circuit and printed circuit board would normally expand and contract by different amounts. This is commonly referred to as a "thermal mismatch". The thermal mismatch causes the electrical contacts on the hybrid circuit to move relative to the electrical contact pads on the printed circuit board as the temperature of the hybrid circuit and printed circuit board change. The relative movement would deform the electrical interconnections between the hybrid circuit and the printed circuit board and place them under mechanical stress. Since these stresses would be applied repeatedly with repeated operation of the device, they would cause breakage of the electrical interconnections. Thermal cycling stresses may occur even where the hybrid circuit and printed circuit board are formed from like materials having similar coefficients of thermal expansion. This is because the temperature of the hybrid circuit may increase more rapidly than the temperature of the printed circuit board when power is first applied to the hybrid circuit. Unfortunately, solid core solder balls are neither flexible nor strong enough to withstand the strain generated by differential rates of thermal expansion.

Commonly assigned U.S. Pat. Nos. 5,148,265; 5,148,266; 5,518,964; 5,659,952; 5,929,517; 5,679,977; 5,685,885; 5,848,467; 5,852,326; 5,950,304; 6,133,627; 5,801,441; 6,104,087; 5,798,286; 5,830,782; 5,959,354; 5,913,109; 6,080,603; and 5,688,716; and U.S. patent application Ser. No. 09/271,688, filed on Mar. 18, 1999, the specifications of which are incorporated by reference herein, provide substantial solutions to the problems of thermal stresses and component testing. Nonetheless, still further improvement is desirable.

SUMMARY OF THE INVENTION

One aspect of the present invention provides a flexible chip carrier. The flexible chip carrier of this aspect of the present invention includes a rigid interposer having first and second surfaces. The rigid interposer is preferably adapted to mount and electrically connect a semiconductor chip onto the first surface of the rigid interposer. An interconnection between the rigid interposer and a semiconductor chip is a "first level" interconnection. The rigid interposer may be adapted to interconnect a semiconductor chip using any of the known methods of creating "first level" interconnections. Some conventional "first level" interconnection methods include wire bonding, tape-automated bonding and flip-chip bonding. The second surface contains a plurality of contacts disposed in a pattern. The area encompassed by the contacts is defined as a "contact pattern area". The rigid interposer is preferably a thin, sheet-like layer material. The rigid interposer may be composed of any rigid dielectric material. Preferred rigid dielectric materials include ceramic materials, such as alumina, beryllia, silicon carbide, aluminum nitride, forsterite, mullite, and glass-ceramics; composite materials, such as polyester/fiberglass, polyimide/fiberglass, and epoxy/fiberglass; and silicon. More preferred rigid dielectric materials are the ceramic materials listed above. The preferred ceramic material is alumina. On preferred embodiments, the rigid interposer contains an electrical circuit. Although the coefficient of thermal expansion, hereinafter "CTE", of the rigid interposer is generally greater than the CTE of a semiconductor chip and generally less than the CTE of an epoxy-polyimide printed circuit board, the CTE of the rigid interposer may be roughly equal to the CTE of the semiconductor chip. This is because other sub-components of the present invention, specifically the flexible interposer and/or the optional compliant layer can compensation for the CTE mismatch between chip and the rigid interposer and the CTE mismatch between the rigid interposer and the flexible interposer.

The flexible chip carrier also includes a flexible interposer that overlies the second surface of the rigid interposer. The flexible interposer has a top surface that faces toward the second surface of the rigid interposer, and a bottom surface that does not. The flexible interposer preferably is a thin, flexible sheet of a polymeric material such as polyimide, a fluoropolymer, a thermoplastic polymer or an elastomer. In preferred embodiments, the flexible interposer contains an electrical circuit. The flexible interposer may have one or more apertures, extending from the top surface of the flexible interposer to the bottom surface.

A plurality of electrically conductive terminals is disposed on the flexible interposer in a pattern on at least one surface selected from the group consisting of the top surface and the bottom surface. In preferred embodiments, either all of the terminals disposed on the top surface or all of the terminals are disposed on the bottom surface of the flexible interposer. At least some of the terminals, and preferably most or all of the terminals, are disposed within the area of the flexible interposer overlying the contact pattern area on the rigid interposer. Generally, each terminal is associated with one contact on the rigid interposer.

The flexible chip carrier also includes a plurality of electrically conductive leads connecting at least some of the contacts on the rigid interposer with at least some of the terminals on the flexible interposer. Each lead has a contact end connected to the associated contact on the rigid interposer and a terminal end connected to the associated terminal on the flexible interposer. The leads and the flexible interposer are constructed and arranged so that the contacts ends of the leads are moveable relative to the terminals at least to the extent required to compensate for differential thermal expansion between the components. The interconnection between the contacts on the rigid interposer and the terminals on the flexible interposer is a second "first level" interconnection. The leads are preferably flexible so that the terminals are moveable with respect to the contacts to accommodate movement caused by differential thermal expansion.

The flexible interposer is flexible to facilitate movement of the contact ends of the leads relative to the terminals and thus to contribute to the ability of the chip carrier to withstand thermal cycling. Each flexible lead may extend through an aperture in the flexible interposer. The flexible leads may be formed integrally with the terminals on the flexible interposer, or else may be separately formed fine wires. Preferably, the leads are curved to provide increased flexibility. The leads may be generally S-shaped. Each lead may be formed from a ribbon of conductive materials having oppositely-directed major surfaces, the ribbon being curved in directions normal to its major surfaces to form a curved configuration of the lead In a preferred embodiment, the lead is S-shaped.

Some preferred arrangements of leads connecting the contacts to the terminals include a "fan-in", "fan-out", "fan-in/fan-out", and area array. In a "fan-in" arrangement, the contacts on the rigid interposer are typically disposed on the periphery of the rigid interposer. The terminals are generally disposed inside the region that overlies the region bounded by the contacts on the rigid interposer. The leads connecting the terminals to the associated contacts fan inwardly. In a "fan-out" arrangement, the contacts on the rigid interposer are again generally disposed on the periphery of the rigid interposer, and the terminals on the flexible interposer are generally disposed in a region that is outside the region that overlies the region bounded by the contacts. The leads connecting the terminals to the associated contacts fan outwardly. In a "fan-in/fan-out" arrangement, some terminals on the flexible interposer are disposed inside the region bounded by the contacts and some are disposed outside the region. Some leads, therefore, fan-in and some fan-out. The rigid interposer contacts typically are disposed in single rows and columns on the second surface and the leads are interdigitated. By the term "interdigitated", it is meant that that fan-in and fan-out leads are interspersed with one another. The preferred interdigitated fan-in/fan-out arrangement is where each lead that is adjacent to a fan-in lead is a fan-out lead and each lead that is adjacent to a fan-out lead is a fan-in lead. In an "area array" arrangement, the contacts on the rigid interposer may be disposed on the periphery of the rigid interposer or may be disposed in a so called area array, i.e., a grid like pattern covering all or a substantial portion of the bottom surface of the rigid interposer. For the leads to be in an area array arrangement, however, the terminals on the flexible interposer must be disposed in area array.

The flexible chip carrier further includes a plurality of joining units. In certain preferred embodiments, each joining unit includes a solid core which is preferably spherical. Each joining unit is disposed on the bottom surface of the flexible interposer, is electrically interconnected to one terminal, and extends downwardly from such terminal. If any terminals are disposed on the bottom surface of the flexible interposer, one of said joining units is preferably disposed directly on each of such terminals. The solid cores are preferably electrically conductive. Preferably, the solid cores are made from copper or nickel.

The flexible chip carrier also includes a unit bonding material. The unit bonding material extends between the terminal and the solid core. Preferably, the unit bonding material is standard lead/tin solder and is provided as a part of the joining unit, as a coating extending over the solid core. The unit bonding material may be used to bond the flexible chip carrier to a printed circuit board or another support substrate.

The flexible chip carrier may also include a compliant layer covering the flexible leads in whole or in part. The compliant layer comprises a dielectric material having a low modulus of elasticity, such as an elastomeric material. Preferred elastomeric materials include silicones, flexiblized epoxies, and thermoplastics. Silicone elastomers are particularly preferred. The dielectric material may be provided in the form of a layer, with holes in the layer aligned with the terminals on the flexible interposer. In preferred embodiments, the compliant layer is formed in at least a two-step process. The first step involves dispensing a controlled amount of a thixotropic or non-slumping silicone elastomer on a portion, but not all, of the bottom surface of the rigid interposer and/or a portion, but not all, of the first surface of the flexible interposer, to create a compliant spacer. The compliant spacer controls the separation between the rigid interposer and the flexible interposer. The second step involves dispensing a second silicone elastomer over the thixotropic or non-slumping silicone elastomer. Compliant spacers and their use in microelectronic assemblies is more fully described in commonly assigned, U.S. Pat. No. 5,659,952, the specification of which is hereby incorporated by reference.

One aspect of the present invention provides a semiconductor chip assembly. The semiconductor chip assembly of the present invention includes the flexible chip carrier described above and at least one semiconductor chip that has been connected to the first surface of the rigid interposer of the flexible chip carrier. The semiconductor chip assembly of the present invention may contain a plurality of semiconductor chips.

If the semiconductor chip assembly contains a plurality of chips, each chip is mounted on and electrically interconnected to the rigid interposer of the flexible chip carrier. Such assemblies may be referred to as multichip modules. Such a multichip module may, for example, comprise a monolithic microwave integrated circuit and a high frequency digital integrated circuit on one rigid interposer that is part of a flexible chip carrier. If both of these high frequency elements are on one rigid interposer, the high frequency elements of the circuit can be isolated from the lower frequency elements. In another embodiment, an integrated circuit in the form of a central processing unit, sometimes referred to as a "cpu", and one or more memory chips may be mounted on a rigid interposer of the present flexible chip carrier to form a semiconductor chip assembly of the present invention. Such an assembly would also be a multichip module.

Preferred methods of connecting the one or more semiconductor chips to the flexible chip carrier include wirebonding, flip chip bonding and tab bonding, with wire bonding and flip chip bonding being more preferred. If the semiconductor chip is to be wire bonded, the rigid interposer should have as plurality of electrically conductive pads disposed in a ring-like pattern. The chip is secured to the first surface of the rigid interposer at the center of the ring-like pattern, so that the contact pads on the rigid interposer surround the chip. The chip is mounted on the first surface of the rigid interposer. The chip is mounted on the rigid interposer in a face-up disposition, with the back surface of the chip confronting the first surface of the rigid interposer, and with the front surface of the chip facing upwardly, away from the rigid interposer so that the electrical contacts on the front surface of the chip are exposed. Fine wires are connected between the electrical contacts on the front surface of the chip and the contact pads on the first surface of the rigid interposer. These wires extend outwardly from the chip to the surrounding contact pads on the first surface of the rigid interposer.

If the semiconductor chip is to be connected to the rigid interposer using flip chip technology, the electrical contacts on the front surface of the chip are provided with bumps of solder. The first surface of the rigid interposer should include a plurality of contact pads arranged in an array corresponding to the array of electrical contacts on the chip. The chip, with the solder bumps, is inverted so that its front surface faces towards the first surface of the rigid interposer, with each electrical contact and solder bump on the chip being positioned on the appropriate contact pad on the first surface of the rigid interposer. The assembly is then heated so as to liquefy the solder and, upon resolidification of the solder, bond each contact on the chip to the confronting contact pad on the first surface of the rigid interposer.

The semiconductor chip assembly of the present invention has at least two "first level" interconnections in the flexible chip carrier. The first "first level" interconnection is the interconnection between the semiconductor chip and the rigid interposer and second "first level" interconnection is the interconnection between the rigid interposer and the flexible interposer.

Another aspect of the present invention provides a test assembly for semiconductor chips. Current semiconductor chip manufacturing techniques do not result in 100% yields, some chips, therefore, will be defective. Often, the defect can not be detected until the chip is operated under power in a test fixture or in an actual assembly. A single bad chip can make a larger assembly, which may include other chips or other valuable components, worthless, or can require painstaking procedures to extricate the bad chip from the assembly. The chips and the mounting components used in a semiconductor chip assembly should, therefore, permit testing of the chips and replacement of the chips before the chips are fused to a substrate.

Semiconductor chips can be tested in the test assembly of the present invention. The test assembly of this aspect of the present invention includes the flexible chip carrier as described above. The test assembly further includes a sheet socket assembly or connector. Preferred sheet socket assemblies and connectors are those described in commonly assigned U.S. Pat. No. 5,615,824; U.S. Pat. No. 5,632,631; U.S. Pat. No. 5,802,699; and U.S. Pat. No. 6,086,386, the specifications of which are incorporated by reference herein.

In preferred embodiments, the sheet socket component or connector includes a planar or sheet like dielectric body having first and second major surfaces and also having a plurality of holes open to the first major surface. The second major surface faces toward the first surface of the rigid interposer of the flexible chip carrier. The holes are disposed in an array corresponding to an array of bumped leads on a semiconductor chip or microelectronic device which is to be tested. The sheet socket assembly further includes an array of resilient contacts secured to the first major surface of the dielectric body in registration with the holes so that each such resilient contact extends over one hole. Each resilient contact is adapted such that it can resiliently engage a bumped lead that has been inserted into the associated hole. The sheet socket assembly also includes a plurality of socket terminals electrically connected to these resilient contacts. Typically, the socket terminals are disposed on the second major surface of the dielectric body in an array corresponding to the array of contact pads on the first surface of the rigid interposer. The socket terminals are electrically connected to the associated resilient contacts. Preferably, each socket terminal is electrically connected to an associated resilient contact by an electrically conductive via, such as a blind via or a through hole via. The sheet socket assembly is mounted and electrically interconnected to the flexible chip carrier by bonding the socket terminals to the associated contact pad on the rigid interposer.

Another aspect of the present invention provides a semiconductor chip assembly comprising the test assembly described above and a semiconductor chip having solder bumps which have engaged and are in physical and electrical contact with the resilient contacts of the test assembly. In preferred embodiments of the semiconductor chip assembly of this aspect of present invention, the semiconductor chip is soldered to the test assembly.

If the semiconductor chip assembly of this aspect of the invention contains more than one chip, the assembly can be described as a multichip module assembly. Each chip of the multichip module can be individually plugged into the test socket assembly of the present invention and the system can be tested. If the system works properly, each of the chips can be soldered in permanently. In the alternative, a module containing at least two chips can be plugged into the test socket assembly and tested. If the system works properly, each of the chips can be soldered in permanently.

The semiconductor chip assembly of the present invention may be incorporated into a larger assembly to form an electronic device. Another aspect of the present invention, therefore, provides an electronic device. The electronic device includes the semiconductor chip assembly described above and a support substrate having pads. The pads are electrically conductive contact pads and are preferably disposed in a pattern corresponding to the pattern of solid core joining units, wherein each pad is associated with a solid core joining unit. The semiconductor chip assembly is positioned on the support substrate such that the bottom surface of the flexible interposer faces toward the support substrate and, preferably, such that the solid core joining units on the bottom surface of the flexible interposer are aligned with the pads on the support substrate. Generally, each solid core joining unit is physically and electrically interconnected to an associated pad on the support substrate.

The flexible chip carrier of the present invention may be incorporated into a larger assembly to form an electronic component. Another aspect of the present invention, therefore, provides an electronic component. The electronic component of the present aspect of the invention includes the flexible chip carrier described above and a support substrate having pads. The pads are electrically conductive contacts pads and are preferably disposed in a pattern corresponding to the pattern of solid core joining units, wherein each pad is associated with a solid core joining unit. The flexible chip carrier is positioned on the support substrate such that the bottom surface of the flexible interposer faces toward the support substrate and, preferably, such that the solid core joining units on the bottom surface of the flexible interposer are aligned with the pads on the support substrate. Generally, each solid core joining unit is physically and electrically interconnected to an associated pad on the support substrate. A semiconductor chip may be bonded to the electronic component to form an electronic device. Preferred bonding methods include wire bonding, flip chip bonding and tab bonding with wire bonding and flip chip bonding being particularly preferred.

Another aspect of the present invention provides a flexible chip carrier or connection component that includes a first, or rigid, interposer, a second, or flexible, interposer, a plurality of conductive structures and a plurality of planar leads. The first interposer has first and second surfaces that are oppositely facing, and the second interposer has top and bottom surfaces that are oppositely facing. The second surface of the first interposer is disposed over the top surface of the second interposer. It should be noted that terms such as "top", "bottom", "vertical", "horizontal", "front", "back", "rear", "over", "under", "below" and the like as used in this present disclosure should be understood as referring to an arbitrary frame of reference, rather than to the ordinary gravitational frame of reference. Thus, the upward vertical direction of a component or assembly may extend upwardly, downwardly or horizontally in the normal gravitational frame of reference. In preferred embodiments the second surface also faces toward the top surface.

The conductive structures of this aspect of the flexible chip carrier are exposed at the first surface of the first interposer. In certain preferred embodiments, the conductive structures include parts (1) that positions within the first interposer but are accessible via the first surface of the first interposer or (2) that are partially embedded in the first interposer and are extended above the first surface of the first interposer. In other preferred embodiments, such parts are disposed on the first surface of the first interposer. The conductive structures also preferably extend through both the first and second interposers.

The planar leads of this aspect of the flexible chip carrier are exposed at the bottom surface of the second interposer. In certain preferred embodiments, the planar leads are positioned within the first interposer but are electrically accessible via the first surface of the first interposer. In other preferred embodiments, the planar leads are partially embedded in the first interposer and are extended below the bottom surface of the second interposer. In yet other preferred embodiments, the planar leads are disposed on the bottom surface of the second interposer. Each planar lead is electrically connected to at least one of the conductive structures. Each planar lead may include a terminal end that is electrically connected to one of the conductive structures and a tip end that is offset from such terminal end. In alternative embodiments, additional interposers may also be disposed between the first and second interposers of this aspect of the present invention so that the electrically conductive paths between the conductive structures and the planar leads may be routed or redistributed as desired.

In preferred embodiments, the flexible chip carrier may further include joining units such as solder balls. Each of the joining units is electrically connected to one of the tip ends.

Another aspect of the present invention provides a connection component that is similar to the above-described flexible chip carrier except the planar leads are not present and the joining units are directly connected to the conductive structures. Additional interposers may also be disposed between the first and second interposers of this aspect of the present invention so that the electrically conductive paths between the conductive structures and the joining units may be routed or redistributed as desired.

Another aspect of the present invention provides a microelectronic component comprising a connection component of the present invention and a microelectronic element having a front surface and a plurality of contacts exposed at the front surface. The microelectronic element is disposed over the connection component, and each of the contacts is electrically connected to one of the conductive structures. The microelectronic element may be, for example, a semiconductor chip, a packaged semiconductor chip, a semiconductor wafer or a multi-chip module.

In one preferred embodiment of the microelectronic component of the present invention, the front surface of a first microelectronic element faces the first surface of the first interposer, and contacts exposed on such front surface are flip chip bonded to the conductive structures. Further processing of this microelectronic component may yield a microelectronic component having one or more microelectronic elements. For example, a second microelectronic element having second contacts may be attached to the rear or back side of the first microelectronic element and such second contacts, which face away from the first microelectronic element, may be electrically connected to additional conductive structures by wirebonds to form a microelectronic component having stacked microelectronic elements.

In another preferred embodiment of the microelectronic component of the present invention, the contacts are wire bonded to the conductive structures. In preferred embodiments, the first surface of the first interposer includes a central region and a peripheral region surrounding the central region. The microelectronic element is disposed over the central region such that the front surface of the microelectronic element faces away from the first surface of the first interposer. Wirebonds are used to electrically connect the contacts to the conductive structures. The microelectronic component of this embodiment may also include one or more additional microelectronic elements that are stacked or otherwise connected to the first microelectronic element.

In preferred embodiments of the microelectronic component of the present invention, the CTE of the first interposer and the CTE of the microelectronic element are substantially similar.

Another aspect of the present invention provides an electronic device comprising the microelectronic component of the present invention and a support substrate having a plurality of electrically conductive contact pads. In preferred embodiments, the support substrate is a printed circuit board having contact pads that are disposed in a pattern corresponding to the pattern of the joining units. The microelectronic component is positioned such that the bottom surface of the second interposer faces the printed circuit board, and each joining unit of the microelectronic component is electrically connected to one of contact pads of the support substrate. Preferably, at least one of the joining units is disposed or positioned below the microelectronic element of the microelectronic component.

Another aspect of the present invention provides a method of making a microelectronic component. Such method has the following steps that may be performed preferably, but not necessarily, in the order presented below to make the microelectronic component. A first interposer having first and second surfaces that are oppositely facing and a second interposer having top and bottom surfaces that are oppositely facing are provided. This second interposer is more flexible than the first interposer. The top surface of the second interposer is positioned or disposed below the second surface of the first interposer. In preferred embodiments, the top surface of the second interposer faces the second surface of the first interposer. A layer of a metal is provided on the bottom surface of the second interposer and is circuitized so that a plurality of planar leads are formed. In preferred embodiments, each planar lead has a tip end and a terminal end. A plurality of openings are formed. These openings extend through both the first and second interposers and expose the terminal ends of the planar leads. An electrically conductive material is disposed in such openings. A microelectronic element such as a semiconductor chip having a front surface and a plurality of contacts exposed at its front surface is disposed over the first surface of the first interposer, and each contact is electrically connected to one of the terminal ends by the electrically conductive material.

Another aspect of the present invention provides another method of making a microelectronic component. In this method, a microelectronic element is disposed over the first surface of the first interposer of one of the connection components of the present invention such that the front surface of the microelectronic element faces away from the first surface. Each of the contacts exposed at the front surface of the microelectronic element is electrically connected to one of the conductive structures exposed at the first surface. In preferred embodiments, the contacts are electrically connected to the conductive structures by wirebonds.

The objects, features and advantages of the present invention will be more readily apparent from the detailed description of the preferred embodiments set forth below, taken in conjunction with the accompanying drawings.

BRIEF DESCRIPTION OF THE DRAWINGS

In these accompany drawings, like reference numerals designate like parts throughout the figures thereof and wherein.

DETAILED DESCRIPTION OF THE PREFERRED EMBODIMENTS

Figure 1:
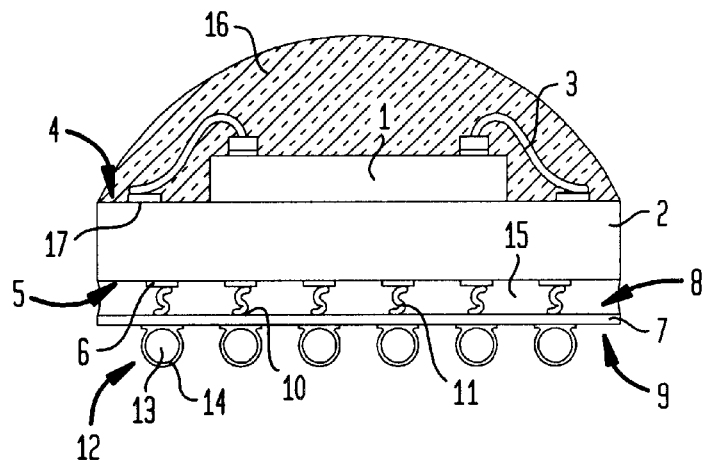
FIG. 1 is a diagrammatic sectional view depicting one embodiment of the semiconductor chip assembly of the present invention.

A semiconductor chip assembly in accordance with one embodiment of the present invention is shown in FIG. 1 and includes a semiconductor chip 1. The semiconductor chip 1 is wire bonded to rigid interposer 2 with wirebonds 3 and contact pads 17. This is a "first level" interconnection. The rigid interposer 2 has a first surface 4, a second surface 5 and a plurality of electrical contacts 6 on such second surface 5. The rigid interposer may be made from any rigid materials and may contain one or more microelectronic components and a circuit (not shown). The assembly must include electrical interconnections between electrical contacts 6 and respective wirebonds 3. When the rigid interposer 2 includes a circuit, the interconnection is accomplished by interconnecting both the electrical contacts 6 and the wire bonds 3 to respective sites on the circuitry.

The assembly further includes a flexible interposer 7 having a top surface 8, a bottom surface 9, apertures (not shown), and terminals 10. The terminals 10 are disposed on the top surface 8 of the flexible interposer 7. The top surface 8 faces the second surface 5 of the rigid interposer 2. The bottom surface 9 faces away from the second surface 5 of the rigid interposer 2. Contacts 6 are electrically interconnected to terminals 10 with flexible electrical connections 11. This is the second "first level interconnection of this assembly. In this embodiment electrical connections 11 are flexible conductive leads. Contacts 6, terminals 10 and leads 11 are disposed in respective area arrays, such as is shown in commonly assigned U.S. Pat. No. 5,518,964, which is incorporated herein by reference.

A plurality of joining units 12 are disposed on the terminals 10. Each joining unit 12 includes a spherical solid core 13 having a diameter which is less than the pitch or distance between adjacent terminals. Preferably, each core is between about 0.25 mm and about 0.5 mm in diameter. All of the cores used in a particular assembly should be of substantially the same diameter. Although the cores may be formed from a dielectric material, the cores are preferably formed from an electrically conductive material, more preferably from a metal such as copper, silver, nickel and alloys or combinations thereof. Copper and copper alloys are particularly preferred. Each joining unit further includes a layer of a unit bonding material or solder 14 such as an alloy of lead and tin covering the core. Solder 14 is adapted to bond to the metal of the core and to metals used in terminals 10. Solder 14 has a melting temperature substantially lower than the solidus temperature of cores 13. As used in this disclosure, the term "solidus temperature" refers to the temperature which the core can withstand while remaining in the solid state, without substantial melting or decomposition.

The assembly further includes a compliant layer 15 formed from an elastomer, gel, adhesive or other compliant material and disposed between the second surface 5 of the rigid interposer 2 and the top surface 8 of the flexible interposer 7 surrounding flexible leads 11.

The assembly further includes a protective coating 16 covering all or a portion of semiconductor chip 1 and leads 11. The protective coating is preferably formed from an elastomer or resin. A particularly preferred protective coating is an epoxy glob top material.

Figure 2:
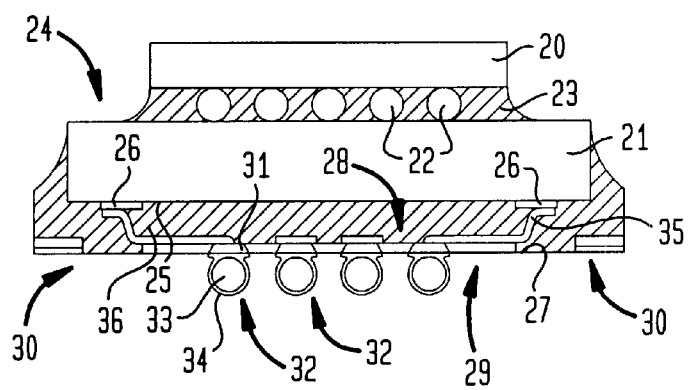
FIG. 2 is a diagrammatic sectional view depicting another embodiment of the semiconductor chip assembly of the present invention.

A semiconductor chip assembly in accordance with another embodiment of the present invention is shown in FIG. 2 and includes a semiconductor chip 20. Chip 20 is flip chip bonded to the rigid interposer 21 using solder balls 22. This is a "first level" interconnection. Chip 22 is underfilled with adhesive 23. Adhesive 23 is preferably a rigid epoxy. The rigid interposer 21 has a first surface 24, a second surface 25 and a plurality of electrical contacts 26 on second surface 25. The assembly must include electrical interconnections between solder balls 22 and contacts 26.

The assembly further includes a flexible interposer 27 having a top surface 28, a bottom surface 29, apertures 30, and conductive vias 31.

The assembly further includes a plurality of joining units 32 disposed on the bottom surface 29. Each joining unit 32 includes a spherical solid core 33 having a diameter which is less than the pitch or distance between adjacent terminals. Preferably, each core is between about 0.25 mm and about 0.5 mm in diameter. All of the cores used in a particular assembly should be of substantially the same diameter. The cores may be formed from an electrically conductive material, preferably a metal such as copper, silver, nickel and alloys or combinations thereof. Copper and copper alloys are particularly preferred. Each joining unit 32 further includes a layer of a unit bonding material 34 extending over the surface of the solid core 33. The preferred unit bonding material is solder. Each joining unit 32 is connected to a via 31.

The assembly further includes electrical connections 35 which connect each contact 26 with an associated joining unit 32 through an associated via 31. This is the second "first level interconnection of this assembly. In this embodiment electrical connections 35 are extended flexible leads. The extended portions of flexible leads 35 together with the vias 31 define terminals.

The assembly further includes a compliant layer 36 formed from an elastomer, gel, adhesive or other compliant material and disposed between the second surface 25 of the rigid interposer 21 and the top surface 28 of the flexible interposer 27, and surrounding flexible leads 35.

Figure 3:
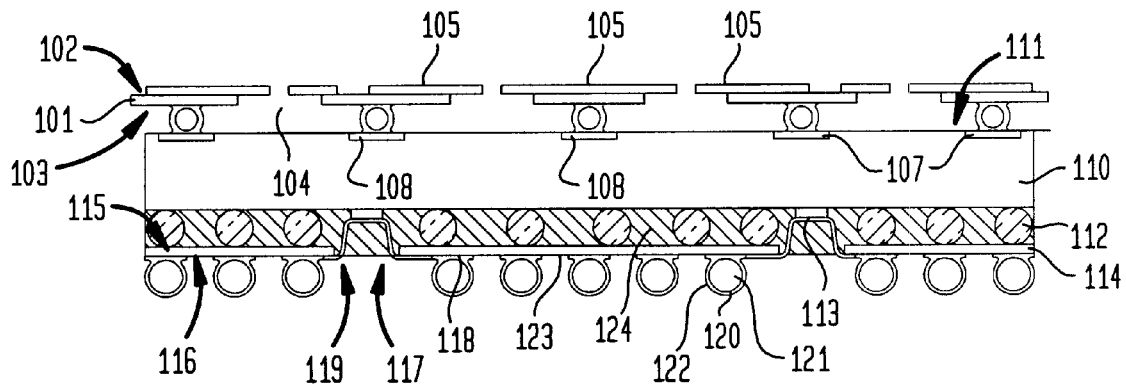
FIG. 3 is a diagrammatic sectional view depicting one embodiment of the test assembly of the present invention.

A test assembly in accordance with one embodiment of the present invention is shown in FIG. 3 and includes a rigid interposer 110 having a first surface 111, a second surface 112 and a plurality of electrical contacts 113 on such second surface 112. The rigid interposer may be made from any rigid materials and may contain one or more microelectronic components and a circuit (not shown).

The assembly further includes a flexible interposer 114 having a top surface 115, a bottom surface 116, apertures, 117, and terminals 118. The terminals 118 are disposed on the bottom surface 116 of the flexible interposer 114. The top surface 115 faces the second surface 112 of the rigid interposer 110. The bottom surface 116 faces away from the second surface 112 of the rigid interposer 110. Contacts 113 are electrically interconnected to terminals 118 with electrically connections 119. Electrical connections 119 are flexible leads and are arranged in a fan-in/fan-out arrangement.

A plurality of joining units 120 are disposed on the terminals 118. Each joining unit 120 includes a spherical solid core 121 having a diameter which is less than the pitch or distance between adjacent terminals. Preferably, each solid core 121 is between about 0.25 mm and about 0.5 mm in diameter. All of the solid cores 121 used in a particular assembly should be of substantially the same diameter. The cores may be formed from an electrically conductive material, preferably a metal such as copper, silver, nickel and alloys or combinations thereof. Copper and copper alloys are particularly preferred. Each joining unit further includes a layer of a unit bonding material or solder 122 such as an alloy of lead and tin covering the solid core 121. Solder 122 is adapted to bond to the metal of the solid core 121 and to metals used in terminals 118. Solder 122 has a melting temperature substantially lower than the solidus temperature of the solid core 121. In preferred embodiments, solder 122 is a lead tin solder.

The test assembly further includes complaint spacers 123. The compliant spaces are preferably formed from an elastomer. The assembly further includes a compliant layer 124 formed from an elastomer, gel, adhesive or other compliant material and disposed between the second surface 112 of the rigid interposer 110 and the top surface 115 of the flexible interposer 114 surrounding flexible leads 119.

The test assembly further includes a socket assembly comprising a sheet-like dielectric body 101 having a first major surface 102, a second major surface 103 and a plurality of holes 104. The second major surface 103 faces toward first surface 111 of rigid interposer 110. The socket assembly further includes a plurality of resilient contacts 105 secured to first major surface 102. Each resilient contact 105 extends over one hole 104. The socket assembly also includes a plurality of socket terminals 106 mounted on the second major surface 103 of the sheet-like dielectric body 101. Each socket terminal 106 is electrically connected an associated resilient contact 105 by a blind via (not shown). Socket terminals are generally conductive standoffs which in this embodiment make use of solid core solder balls. Each socket terminal 106 has a solid spherical core 108. The diameter of each solid spherical core 108 is approximately the same. Each socket terminal 106 acts as spacer unit to insure a minimum separation between the sheet-like dielectric body 101 and the rigid interposer 110. The socket terminals 106 are disposed in an array which corresponds to the array of contact pads 107 on the first surface 111 of the rigid interposer 110. Socket terminals 106 are soldered to contact pads 107.

One or more microelectronic elements may be incorporated into the test socket assembly of the present invention. Such microelectronic elements include single semiconductor chips, a plurality of individual semiconductor chips, a plurality of interconnected semiconductor chips or a wafer of un-diced semiconductor chips. Other microelectronic elements, such as resistors, capacitors, inductors, etc., may also be connected to the test socket assembly. The plurality of interconnected chips may be in the form of a multichip module.

The microelectronic element may be temporarily plugged into the test socket assembly in order to test the microelectronic element. If the element is working properly, then the microelectronic element can be permanently incorporated into the test socket assembly to form a microelectronic device. Such elements will typically include a bottom side with a plurality of solder balls. The element is plugged into the test socket assembly such that one or more of the solder balls of the element engages the resilient contacts of the test socket assembly. The element is tested to insure that it is working properly. The element may then be removed and later incorporated into a separate microelectronic device or the element may be permanently attached to the test socket assembly to form a microelectronic device. One method of permanently incorporating the element is by heating the solder balls to liquefy the solder and then resolidifying the solder.

Furthermore, one or more microelectronic elements may be incorporated into the aforementioned assembly of the present invention to form an electrically interconnected circuit between such elements. For example, the rigid interposer may include conductive traces which interconnect contact pads in different regions of the rigid interposer with one another. The circuitry interconnecting the contact pads may also include traces on the flexible interposer connected to the contact pads through additional contacts on the bottom surface of the rigid interposer and flexible leads attached to these additional leads.

Figure 4:
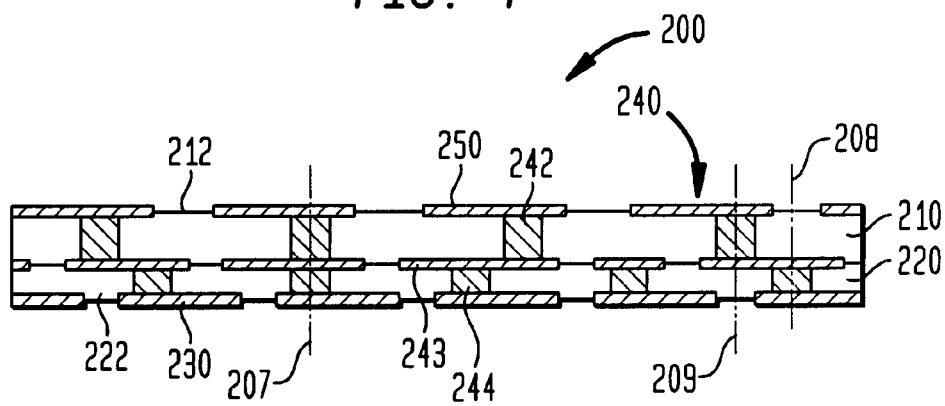
FIG. 4 is a diagrammatic sectional side view depicting one embodiment of the flexible chip carrier of the present invention.

FIG. 4 illustrates a flexible chip carrier, or connection component 200, according to one embodiment of the present invention. The connection component 200 comprises a rigid, or first, interposer 210 having a first surface 212 and a second surface. The first surface 212 and the second surface are oppositely facing. Generally the thickness of the first interposer 210 is between microns and 100 microns and 200 microns. Such thickness is preferably between 125 microns and 175 microns and more preferably between 140 microns and 160 microns.

In preferred embodiments, the first interposer 210 is comprised of a rigid dielectric material. Preferred rigid dielectric materials include alumina, beryllia, silicon carbide, aluminum nitride, forsterite, mullite, silicon, glass/ceramic composite, polyester/fiberglass composites, polyimide/fiberglass composites, epoxy/fiberglass composites, bismaleimide triazine (hereinafter "BT"), and BT/epoxy composites. Preferred epoxy/fiberglass composites include FR-4, which is constructed of multiple plies of epoxy-resin-impregnated woven glass cloth and FR-5, which is constructed of multiple plies of woven glass cloth impregnated with mostly polyfunctional epoxy resin.

The connection component 200 further includes a flexible, or second interposer, 220 having (1) a top surface that is disposed below and preferably adjacent to the second surface of the first interposer 210 and (2) a bottom surface 222. The top and bottom surface 222 are oppositely facing. Generally the thickness of the second interposer 220 is between 30 microns and 70 microns. Such thickness is preferably between 40 microns and 60 microns and more preferably between 45 microns and 55 microns. In preferred embodiments, the second interposer 220 is comprised of a flexible dielectric material. Preferred flexible dielectric materials are polyimides, fluoropolymers, thermoplastic polymers, and elastomers. The second interposer 220 preferably is more flexible than the first interposer 210. In preferred embodiment, the second interposer is compliant The connection component 200 further includes a plurality of conductive structures 240 exposed at the first surface 212 of the first interposer 210. In certain preferred embodiments, the conductive structures 240 include parts (1) that are positioned in the first interposer 210 but are electrically accessible via the first surface 212 of the first interposer 210 or (2) that are partially embedded in the first interposer 210 and are extended above the first surface 212 of the first interposer 210 such as electrically conductive elements 250 of the conductive structures 240 shown in FIG. 4. In other preferred embodiments, these parts are disposed on the first surface 212 of the first interposer 210.

In preferred embodiments, at least one and preferably each of the conductive structures 240 includes (1) a first portion 242 that extends from the first surface 212 to the second surface of the first interposer 210 and (2) a second portion 244 that extends from the top surface to the bottom surface 222 of the second interposer 220. In one preferred embodiment, the first and second portions respectively extend through the first and second interposers 210, 220 along a common axis 207. In another preferred embodiment, the first and second portions 210, 220 respectively extend through the first and second interposers 210, 220 along different axes 208, 209. In this later preferred embodiment, at least one of the conductive structures 240 further includes an electrically conductive trace 243. Such electrically conductive trace 243 electrically connects one of the first portions 242 to one of the second portions 244. In certain preferred embodiments, one or more of the conductive structures 240 may further include the electrically conductive element 250 exposed at the first surface 212 of the first interposer 210 as indicated above and electrically connected to one of the first portions 242. Such electrically conductive element 250 may include a trace, a lead, a terminal, a joining unit or a pad to which another component may be electrically connected.

The connection component further includes a plurality of planar leads 230 exposed at the bottom surface 222 of the second interposer 220. Each of the planar leads 230 is electrically connected to at least one of the conductive structures 240. In certain preferred embodiments, the planar leads 230 are positioned within the first interposer 210 but are electrically accessible via the first surface 212 of the first interposer 210. In other preferred embodiments, the planar leads 230 are partially embedded in the first interposer 210 and are extended below the bottom surface 222 of the second interposer 220. In yet other preferred embodiments, the planar leads 230 are exposed at the bottom surface 222 of the second interposer 220. The planar leads 230 are extending along a plane that is substantially parallel to the plane defined by the bottom surface 222 of the second interposer 220. In those preferred embodiments in which the planar leads 230 are exposed at the bottom surface 222, such planar leads 230, in effect, are extending substantially along the bottom surface 222.

The dimensions of each planar lead 230 may vary depending on each desirable application. Generally the thickness of each planar lead 230 is between 10 microns and 55 microns, the width of each planar lead 230 is between 10 microns and 50 microns, and the length of each planar lead 230 as measured from end (e.g., tip end) to end (e.g., terminal end) and along such planar lead 230 is between 100 microns and several millimeters. In preferred embodiments, the thickness is between 20 microns and 30 microns, the width is between 30 microns and 35 microns, and the length is between 100 microns and 500 microns.

Figure 5:
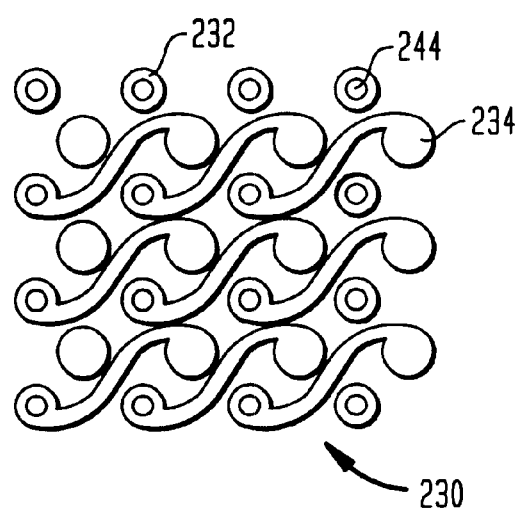
FIG. 5 is a diagrammatic top view illustrating a plurality of planar leads of one embodiment of the connection component of the present invention.

FIG. 5 illustrates one embodiment of the planar leads 230 in more detail. Each planar lead 230 includes a terminal end 232 and a tip end 234. The terminal ends 232 are electrically connected to the second portions 244 of the conductive structures 240. In preferred embodiments, the planar leads 230 are curved substantially along the plane along which the planar leads are also extending (see FIGS. 5 and 7D). In certain preferred embodiments, the planar leads 230 are S-shaped as illustrated in FIG. 5. If the connection component 200 is electrically connected to a microelectronic element, for example, a semiconductor chip, as further described below, thermal cycling associated with the operation of the semiconductor chip may cause the planar leads 230 to flex. The planar leads 230 may be flexible in a direction having a direction vector in (1) a horizontal plane defined by the bottom surface 222 of the second interposer 220, (2) a vertical plane that is perpendicular to the horizontal plane or (3) a plane that is neither parallel nor perpendicular to the horizontal plane. In preferred embodiments, the planar leads 230 are substantially flexible in the horizontal or vertical direction vector. In preferred embodiments, the tip end 234 of planar lead 230 is movable with respect to the terminal end 232 of such planar lead 230 or with respect to a particular conductive structure 240 to which such planar lead 230 is electrically connected.

In yet another embodiment, the connection component 200 may further include a third interposer (not shown) and a fourth interposer (not shown) disposed between the first and second interposers 210, 220. More specifically, the third interposer is disposed over the top surface of the second interposer 220 and the fourth interposer is disposed below the second surface of the first interposer 210 and over the third interposer. In preferred embodiments, the third interposer comprises a rigid dielectric material as described above, and the fourth interposer comprises a flexible dielectric material as described above. Thus, both the second and fourth interposers are preferably more flexible than both the first and third interposers. In this embodiment, the conductive structures extend through all four interposers. By including such additional third and fourth interposers, the electrically conductive paths of the conductive structures may be routed and redistributed as desired. For example, it may be desirable to redistribute such paths to provide a specific package footprint and/or solder ball arrangement.

In yet another embodiment, the connection component 200 further may include joining units (indicated by reference numeral 270 in FIG. 6) such as solder balls or solid core, solder balls for example. In preferred embodiments, these joining units are electrically connected to the tip ends of the planar leads 230. In certain preferred embodiments, such joining units may be directly and electrically connected to the second portions 244 of the conductive structures 240. In other words, the connection component 200 of this latter embodiment does not necessarily include any planar leads 230.

Figure 6:
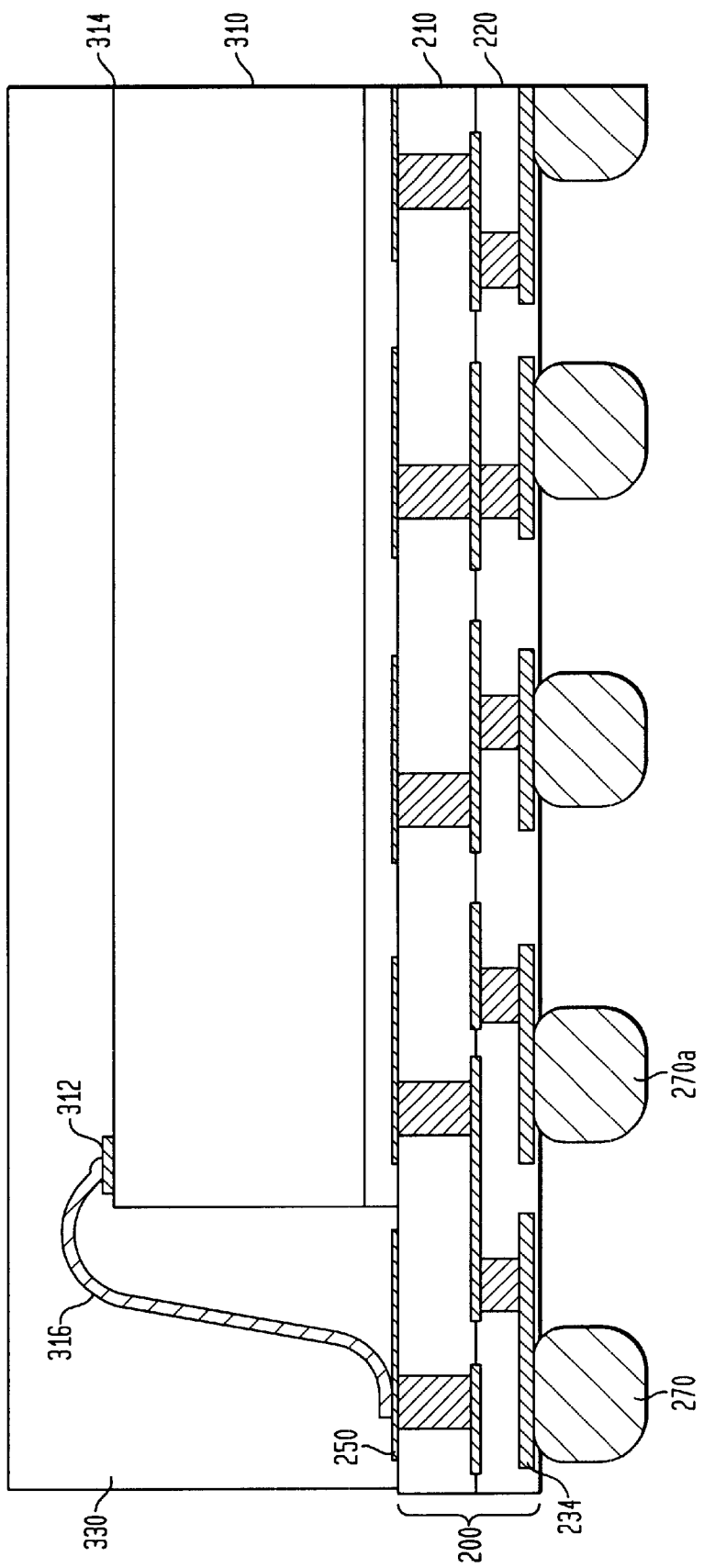
FIG. 6 is a diagrammatic sectional side view illustrating one embodiment of the microelectronic component of the present invention.

FIG. 6 illustrates one preferred embodiment of a microelectronic component 300 that comprises a microelectronic element 310 and a connection component 200 of the present invention. The microelectronic element 310 has a front surface 314 and a plurality of contacts 312 exposed at the front surface 314. In this preferred embodiment, the first surface 212 of the first interposer 210 includes a central region and a peripheral region surrounding the central region. The microelectronic element 310 is disposed over and is preferably adhered to the central region so that the front surface 314 of the microelectronic element 310 faces away from the first surface 212 of the first interposer 210. Preferably, the microelectronic element 310 and the first interposer 210 have a common CTE so as to reduce the thermal mismatch between them during the operation of the microelectronic element 310.

In this preferred embodiment, at least one of the conductive structures 240 includes a first portion 242 that extends through the first interposer 210 and a second portion 244 that extends through the second interposer 220. Preferably, these first and second portions 242, 244 respectively extend through the first and second interposers 210, 220 along a common axis or through the first and second interposers 210, 220 along different axes. In certain embodiments, the vertical axis of the center of the first portion 242 is not coextensive with the vertical axis of the center of the second portion 244. When the first and second portions 242, 244 are not extending along a common axis, the first and second portions 242, 244 may be electrically connected by an electrically conductive trace 243 of the conductive structure 240. At least one of the conductive structures 240 preferably includes an electrically conductive element 250 that is disposed on the first surface 212 of the first interposer 210 and that is electrically connected to the first portion 242. Such electrically conductive element 250 has a bonding terminal or pad (not shown) that is disposed in the peripheral region of the first surface 212 and that is electrically connected to one of the contacts 312 by a wirebond 316 downwardly extending along a side of the microelectronic element 310. Typically, the bonding terminal mainly comprises a metal such as copper and its surface to which the wirebond is electrically connected comprises a noble metal such as gold to prevent oxidization. Encapsulant 330 is provided to hold such wirebonds 316 and to protect them from being damaged.

As described above, these planar leads 230 are preferably curved. More preferably such curved leads are S-shaped. During the operation of the microelectronic element 310 thermal cycling associated with the microelectronic component 300 may cause the planar leads 230 to flex in the horizontal and/or vertical plane described above. In preferred embodiments, the planar leads flex in at least the horizontal plane. In preferred embodiments, at least one of the tip ends 234 of the planar leads 230 is movable with respect to the associated terminal end 232 of the planar lead 230, the conductive structure 240 electrically connected to the planar lead 230, the microelectronic element 310, or the contact 312 electrically connected to such conductive structure 240. In such preferred embodiments, at least one of the joining units is movable with respect to the contact 312 Although the present invention is not limited to any theory of operation, it is believed that the flexibility of each planar lead 230 effectively compensates for at least a portion of the differential thermal expansion between the microelectronic element 310 and, for example, a printed circuit board to which the microelectronic component 300 may be mounted and that such compensation substantially reduces solder balls fatigue and thus increases the reliability of the microelectronic component 300.

Although all of the joining units may seem to be disposed below the microelectronic 310, it should be noted that all of the joining units 270 of the microelectronic component 300 are preferably disposed below the peripheral region of the first surface 212 and thus are not disposed below the microelectronic element 310. However, in some preferred embodiments, at least one of the joining units 270, for example the joining unit 270a of FIG. 6, may be disposed below the microelectronic element 310 and thus below the central region of first surface 212 of the first interposer 210.

In other preferred embodiments of the present invention, the contacts 312 of the microelectronic element 310 arranged in an area array are flip chip bonded to the conductive structures 240 of the flexible chip carrier 200. As previously described, the front surface 314 of the microelectronic element 310 faces the first surface 212 of the first interposer 210 so that the contacts 312 may be directly connected to the corresponding conductive structures 240. In this preferred "flip-chip" embodiment, the conductive structures 240 do not have any electrically conductive elements 250. Thus, the area array of the contacts 312 would be corresponded to the area array of the first portions 244 of the conductive structures 240. In preferred embodiments, a metal such as gold bumps, gold stud bumps, or solder bumps, such as for example C4 or other lead/tin solder, is disposed on contacts 312. Each of these bumps is electrically connected to one of the joining units 270, and at least one of the joining units 270 may be disposed below the microelectronic element 310.

In certain embodiments of the preferred flip-chip embodiment, the contacts 312 are bare aluminum die pads, and the first portions 244 of each conductive structure comprises an electrically conductive material such as conductive polymer and preferably conductive adhesive, instead of a metal. Preferably, the amount of such conductive adhesive disposed in each opening of the first interposer 210 is sufficient to the extent that the front surface 314 of the microelectronic element 310 and the first surface 212 of the first interposer 210 are flush when the die pads are electrically connected to the first portions 244 because the die pads are extended into the openings and below the first surface 212 of the first interposers 210 and are electrically connected to the conductive adhesive. Each of such die pads is electrically connected to one of the joining units 270, and at least one of the joining units 270 is disposed below the microelectronic element 310.

In other embodiments of the preferred flip-chip embodiment, the contacts 312 include die pads with gold or solder bumps, and the first portions 244 comprise an electrically conductive material such as solder, instead of a metal. When the front surface 314 is juxtaposed against the first surface 212 so that both the pads and bumps of the contacts are located in the openings containing the solder, such solder is reflowed to electrically connect the bumps and the solder paste. The reflowing process may be achieved, for example, by heating the microelectronic element 310 prior to juxtaposing it against the first interposer 210. Such extensions of the contacts into the openings may minimize the need for the underfilling process, which can be labor intensive and costly, and may even produce unreliable microelectronic components due to voids locating therein. Each of the contacts is electrically connected to one of the joining units 270, and at least one of the joining units 270 is disposed below the microelectronic element 310.

Once a flip-chip microelectronic component is assembled in accordance with the present invention, a second microelectronic element may further be electrically connected to the flip-chip microelectronic component so as to form a stacked microelectronic component (not shown). In this embodiment, the second microelectronic element includes a plurality of contacts disposed on its front surface. In addition to the area array of conductive structures, the connection component further includes additional conductive structures that have electrically conductive elements exposed in the peripheral region of the first interposer (not shown). These additional conductive structures are also electrically connected to additional planar leads exposed at the bottom surface of the second interposer as previously described (not shown). To accommodate for the additional conductive structures and planar leads, the connection component of this stacked microelectronic component needs to be and is wider than the connection component of the flip-chip microelectronic component described above. Regarding the mechanical and electrical connections between the second microelectronic element and the flip-chip microelectronic component, this second microelectronic element may be adhesively attached to the rear surface of the first microelectronic element, being flip-chipped to the connection component, such that the front surface of the second microelectronic element faces away from the first microelectronic element. The contacts of the second microelectronic element are electrically connected to the electrically conductive elements by a plurality of wirebonds. The contacts of the second microelectronic element are preferably disposed in the peripheral region of the front surface of the second microelectronic element.

Figure 7A:
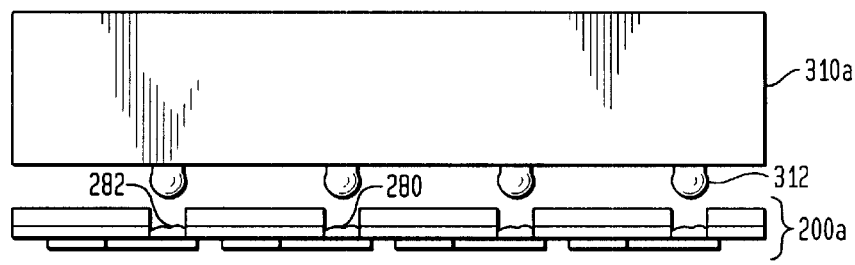
FIGS. 7A–7C and 7D are diagrammatic sectional side and perspective views, respectively, depicting one embodiment of the method of making a microelectronic component of the present invention.
Figure 7B:
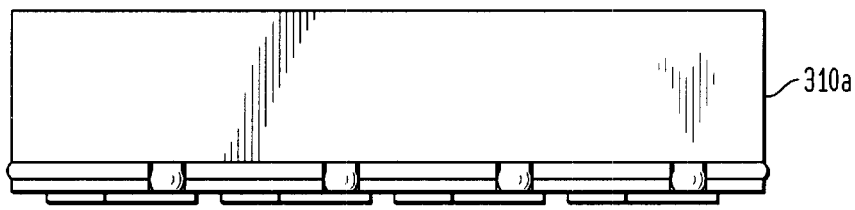

A method of making a present inventive microelectronic component 400 (FIGS. 7C and 7D) is explained below with reference to FIGS. 7A–7D. A connection component 200a is provided and is illustrated in FIG. 7A. There are a plurality of openings 280 extending through the first and second interposers 210, 220 and exposing the terminal ends of the planar leads 230. Into these openings 280, an electrically conductive material 282 such as conductive polymer, conductive adhesive, solder or solder paste may be disposed therein. If the electrically conductive material 282 is solder or solder paste, it may be reflowed once the contacts 312 of the microelectronic element 310a are placed in such openings 280 as shown in FIG. 7B. Due to the reflow of the solder, the planar leads 230 are electrically connected to the contacts 312 of the microelectronic element 310. Alternatively, the openings 280 may be empty and the contacts 312 may include solder bumps that are reflowable once such contacts 312 are placed in the empty openings (not shown).

Figure 7C:
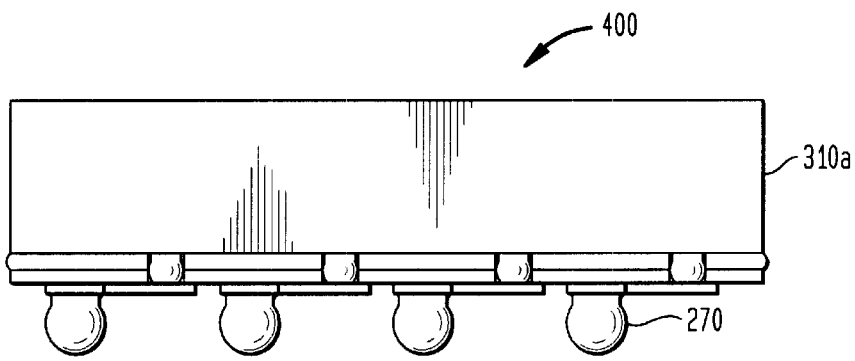
Figure 7D:
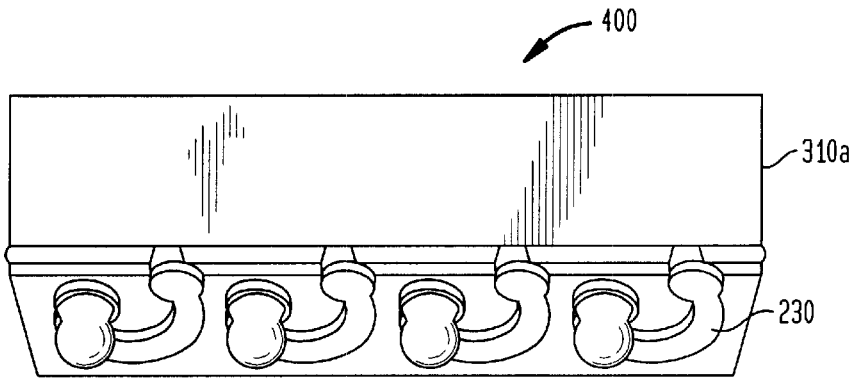

FIG. 7C illustrates a side view of the microelectronic component 400 of FIG. 7B that includes a plurality of joining units 270 electrically connected to the tip ends of the planar leads 230. FIG. 7D illustrates a perspective view of the microelectronic component 400 of FIG. 7C. In preferred embodiments, the joining units 270 are movable with respect to the terminal ends, the microelectronic element 310a or the contacts as discussed above. At least some of the joining units 270 are disposed below the microelectronic element 310, and preferably all the joining units 270 are disposed below the microelectronic element 310.

Figure 8A:
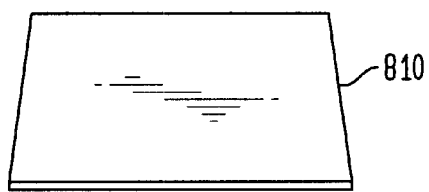
FIGS. 8A–8H are diagrammatic perspective views illustrating another embodiment of the method of manufacturing the microelectronic component of the present invention. It should be noted that FIG. 8E illustrates a bottom perspective view of a partially-finished connection component shown in FIG. 8D.
Figure 8B:
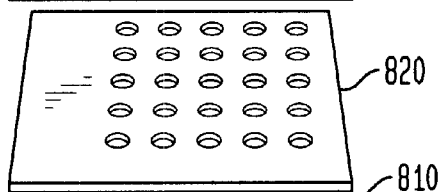
Figure 8C:
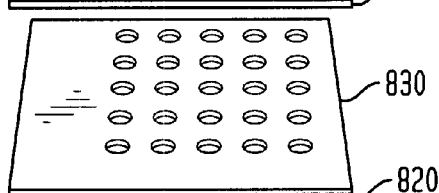
Figure 8D:
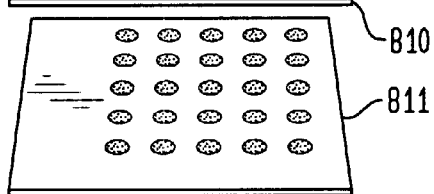

Another method of manufacturing a present inventive microelectronic component 500 (FIG. 8H) is explained below with reference to FIGS. 8A–8H. In FIG. 8A, a layer 810 of a metal is provided. Preferably, the metal layer 810 comprises copper. In FIG. 8B, a second interposer 820, similar to the above-described second interposer 220, is disposed over the metal layer 810. The second interposer 820 has top and bottom surfaces that are oppositely facing. In preferred embodiments, the bottom surface is juxtaposed with or laminated to the metal layer 810 such that the top surface faces away from the metal layer 810. A plurality of openings that extend through the second interposer 820 are formed. In preferred embodiments, such openings are arranged in an area array. In FIG. 8C, a first interposer 830, similar to the above-described first interposer 210, is disposed over the second interposer 820. The first interposer 830 has first and second surfaces that are oppositely facing. In preferred embodiments, the second surface is juxtaposed with or laminated to the top surface of the second interposer 820 such that the first surface of the first interposer 830 faces away from the second interposer 820. A plurality of openings that extend through the first interposer 830 are formed. Preferably, such openings of the first interposer 830 are corresponded to the openings of the second interposer 820. Thus, when an electrically conductive material 811 such as conductive adhesive or solder paste is disposed or stenciled into the openings of both the first and second interposers, such electrically conductive material is electrically connected to the metal layer 810 as shown in FIG. 8D and is exposed at the first surface of the first interposer 830. In preferred embodiments, the openings in both the first and second interposers are formed by lasing or mechanically punching through such interposers.

Figure 8E:
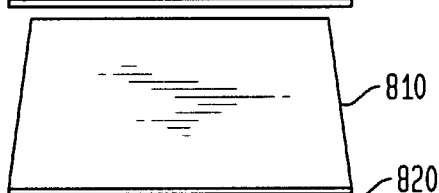
Figure 8F:
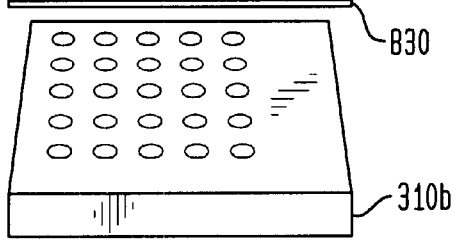
Figure 8G:
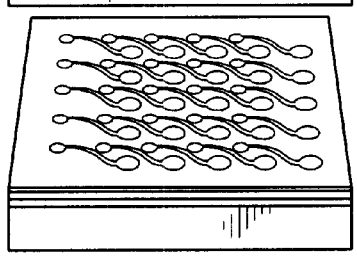
Figure 8H:
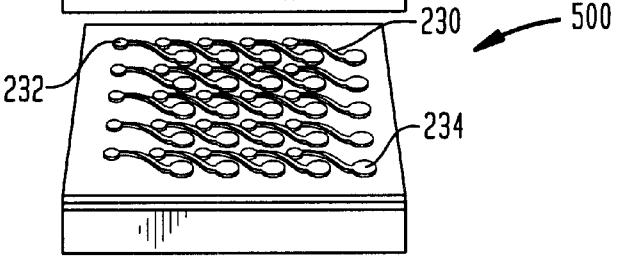

FIG. 8E illustrates a bottom perspective view of a partially-finished connection component shown in FIG. 8D. It should be noted that both FIG. 8E depicts a bottom plan view of the structure depicted in FIG. 8D. As shown in FIG. 8E, the first interposer 830 faces the microelectronic element 310 illustrated by FIG. 8F. The microelectronic element 310 includes a plurality of contacts corresponding to the openings of the first and second interposers. When the microelectronic element 310 is juxtaposed with the first interposer 830 (FIG. 8G), the contacts are electrically connected to the electrically conductive material 811 disposed in the openings and thus the contacts are also electrically connected to the metal layer 810. Then, the metal layer 810 is circuitized to form plurality of planar leads 230 (FIG. 8H). In preferred embodiments, the metal layer 810 is photo-lithographically imaged and patterned and portions of the metal layer are etched away to form the planar leads 230. As described above, these planar leads 230 include a tip end 234 and a terminal end 232. The terminal ends 232 are electrically connected to the contacts of the microelectronic element 310 by the electrically conductive material 811 disposed in the openings. Joining units (not shown) may further be electrically connected to the tip ends so as to provide means for the interconnection to another substrate such as a printed circuit board. Preferably, all of the joining units are positioned below the microelectronic element.

In certain preferred embodiments, the partially-finished connection component shown in FIG. 8D is further processed so as to include additional openings (not shown) that extend through both the first and second interposers 830, 820, that locate in the peripheral region of both the rigid and flexible interposers 830, 820, and that surround the plurality of openings. An electrically conductive material such as a metal may be deposited into such additional openings so as to form bonding terminals or pads (not shown) exposed at the first surface of the first interposer 830. Using the metal layer 810 as a commoning layer, such deposition may be achieved by electroplating copper into such additional openings to form the bonding terminals. In preferred embodiments, an oxidation resistant material, such as gold or another noble metal may be deposited on the exposed surfaces of the bonding terminals to minimize oxidization of such exposed surfaces. The metal layer 810 is circuitized to form a plurality of the planar leads 230. Each planar lead 230 has a terminal end 232 and a tip end 234. Some of the terminal ends 232 are electrically connected to the bonding terminals and some of the terminal ends 232 are electrically connected to the electrically conductive material disposed in the openings.

Once the contacts 312 of the first microelectronic element 310a are flip chip bonded to the electrically conductive material 811, contacts of a second microelectronic element (not shown) may be electrically connected to the bonding terminals to form a stacked microelectronic component. In preferred embodiments, the second microelectronic element is adhesively attached to the back or rear surface of the microelectronic element 310a and such contacts of the additional microelectronic element may be electrically connected to the bonding terminals by a plurality of wirebonds. Joining units (not shown) may further be electrically connected to the tip ends 234 so as to provide means for the interconnection to another substrate such as a printed circuit board. Preferably, all of the joining units electrically connected to the bonding terminals are not positioned or disposed below the first and microelectronic elements and all of the joining units electrically connected to the electrically conductive material 811 are positioned or disposed below the first or the second microelectronic element.

Figure 9A:
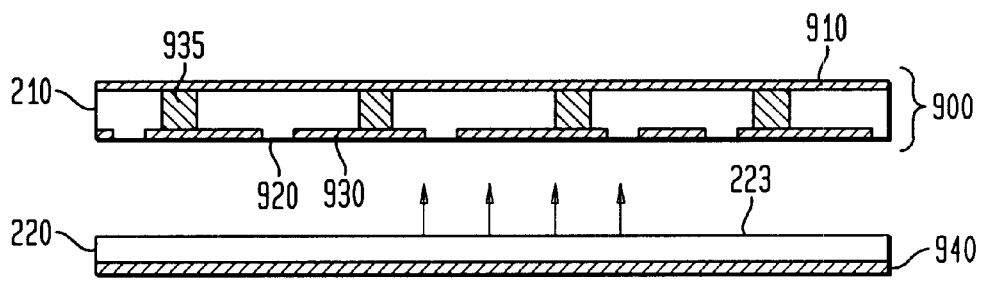
FIGS. 9A–9C are diagrammatic sectional side views depicting another embodiment of the method of manufacturing the microelectronic component of the present invention.
Figure 9B:
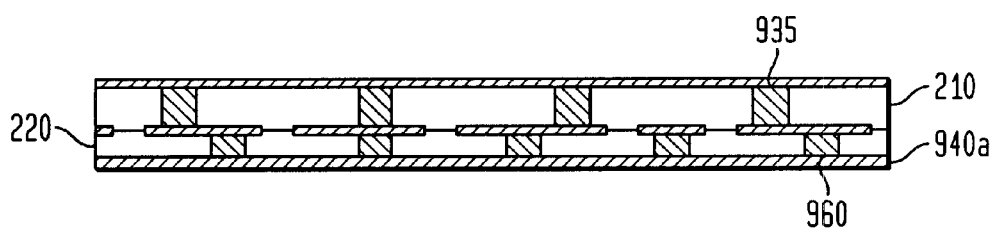
Figure 9C:
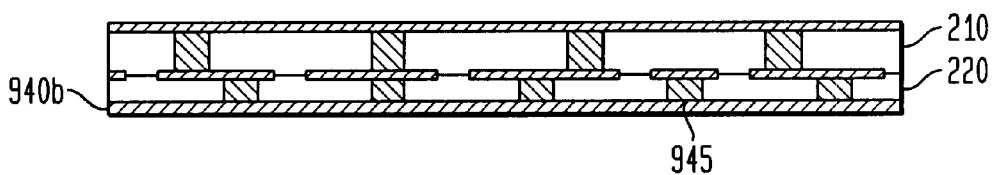

FIGS. 9A–9C illustrate another method of manufacturing a microelectronic component of the present invention. In FIG. 9A, a circuitized substrate 900 is provided. This circuitized substrate 900 comprises a first interposer 210 having a first surface and a second surface 920 that are oppositely facing. A layer of a first metal 910 is provided over the first surface of the first interposer 210, a layer of a second metal 940 is provided under the bottom surface of the second interposer 220, and a plurality of electrically conductive traces 930 exposed at the second surface 920. At least some of such traces 930 are electrically connected to the first metal layer 910 preferably by conductive vias 935. A second interposer 220 is provided. The second interposer 220 has a top surface 223 and a bottom surface that are oppositely facing. As describe above, the second interposer 220 is more flexible than the first interposer 210. The top surface 223 of the second interposer 220 is juxtaposed with the second surface 920 of the first interposer 210. This may be achieved by, for example, laminating the second interposer 210 to the circuitized substrate 900. In certain preferred embodiments, the second interposer 220 may comprise first and second layers (not shown) of a common dielectric material. Preferably, the dielectric materials are polyimides, thermoplastics, elastomers or flexiblized epoxies. The first layer defines the bottom surface of the second interposer 220 and is fully cured. The second layer defines the top surface 923 of the second interposer 220 and is partially cured or in a B-staged state. When the second interposer 220 is juxtaposed with the circuitized substrate 900, heat, pressure or both heat and pressure may be applied to the second interposer and preferably to the metal layer 940 so as to cause the second layer of the second interposer 220 to become fully cured. Preferably, such heat or pressure is applied to the second metal layer 940. As a result, the second interposer 220 and the circuitized substrate 900 are securely attached. In other preferred embodiments, the fully-cured first layer of the second interposer 220 comprises a first dielectric material and the partially-cured second layer of the second interposer 220 comprises a second dielectric material. Preferred first dielectric materials are polyimides, fluoropolymers, thermoplastic polymers or elastomers, and preferred second dielectric materials also are polyimide, a fluoropolymer, a thermoplastic polymer or an elastomer. The above-described second interposer 220 having the first and second layers comprising of a common dielectric material or different dielectric materials and the attachment of such second interposer 220 to the first interposer 210 are also applicable to the methods associated with FIGS. 7A–7D and 8A–8H.

Once the top surface 223 of the second interposer 220 is securely attached to the second surface 920 of the first interposer 210, a plurality of openings 960 are formed as illustrated in FIG. 9B. Each opening extends through both the second interposer 220 and the second metal layer 940 and exposes a portion of one of the electrically conductive traces 930. Using the first metal layer 910 as a commoning layer, metal is deposited into the openings 930 by electroplating so as to form a plurality of conductive vias 945 that electrically interconnect the remained second metal layer 940a of FIG. 9B and the traces 930 as shown in FIG. 9C. The second metal layer 940b of FIG. 9C is circuitized so that a plurality of planar leads 230 are formed as seen in FIG. 4. The first metal layer 910 is also circuitized so that a plurality of electrically conductive elements 250 are formed as also seen in FIG. 4. Referring to FIG. 9B, if the first metal layer 910 is circuitized to form the electrically conductive elements 250 prior to the step of electroplating the metal into the openings 960, there is no commoning layer for electroplating. However, such metal may still be deposited into the openings 960 by seeding walls of the openings 960 with a metallic material and then electroless plating additional metal into the openings 960 to form the conductive vias 945.

The method may further include providing a microelectronic element having an array of contacts on its front surface. The microelectronic element is juxtaposed with a central region of the first interposer 210 such that the front surface of the microelectronic element faces away from the first surface 212 of the first interposer 210 as illustrated in FIG. 6. In a peripheral region of the first surface 212 of the first interposer 210, which surrounds the central region, a plurality of bonding terminals (not shown) of the electrically conductive elements 250 are exposed. Each bonding terminal is electrically connected to one the contacts of the microelectronic element by a wirebond that extends along an edge of the microelectronic element. Thus, each contact may be electrically connected to at least one of the conductive structures 240 and to one of the planar leads 230. During the operation of the microelectronic element, at least one of the tip ends is movable with respect to the associated terminal end 232 of the planar lead 230, the conductive structure 240 electrically connected to the planar lead 230, the microelectronic element 310, or the contact 312 electrically connected to such conductive structure 240.

One preferred method of the present invention includes providing a plurality of joining units such as solder balls and attaching such solder balls to the tip ends of the planar leads 230. Such joining units enable the microelectronic component to be electrically connected to a support substrate such as a printed circuit board so as to form an electronic device. In certain preferred embodiments of the present inventive method, the microelectronic element is a semiconductor wafer. Individual microelectronic components may then be formed by a singulation process.

One of the above-described methods of the present invention may be used to make a connection component as a printed circuit board onto which at least one of the microelectronic elements and other electronic components such as active and passive elements are mounted thereon and electrically connected thereto.

As these and other variation and combinations of the features discussed above can be utilized without departing from the present invention as defined in the claims, the foregoing description of the preferred embodiments should be taken as illustrating, rather than limiting, the invention as claimed.

What is claimed is:

1. A connection component comprising:
   a first interposer having first and second surfaces;
   a second interposer having top and bottom surfaces, said top surface being disposed under said second surface, wherein the second interposer is more flexible than the first interposer;
   a plurality of conductive structures exposed at the first surface of the first interposer; and
   a plurality of planar leads exposed at the bottom surface of the second interposer, wherein each of the planar leads is electrically connected to at least one of the conductive structures.

2. The connection component of claim 1, wherein said top surface is adjacent to said second surface.

3. The connection component of claim 2, wherein at least one of the conductive structures includes a first portion that extends through the first interposer and a second portion that extends through the second interposer.

4. The connection component of claim 2, wherein the planar leads are flexible.

5. The connection component of claim 2, wherein the planar leads are curved.

6. A connection component comprising:
a first interposer having first and second surfaces;
a second interposer having top and bottom surfaces, said top surface being disposed under said second surface, wherein the second interposer is more flexible than the first interposer;
a plurality of conductive structures exposed at the first surface of the first interposer; and
a plurality of planar leads exposed at the bottom surface of the second interposer, wherein each of the planar leads is electrically connected to at least one of the conductive structures;
said top surface being adjacent to said second surface;
at east one of the conductive structures including a first portion that extends through the first interposer and a second portion that extends through the second interposer;
each of he conductive structures including a first portion that extend through the first interposer and a second portion that extends through the second interposer.

7. The connection component of claim 6, wherein each of said second portions is electrically connected to one of the planar leads.

8. The connection component of claim 6, wherein said first and second portions extend through the first and second interposers along a common axis.

9. The connection component of claim 6, wherein said first and second portions extend through the first and second interposers along different axes.

10. The connection component of claim 6, wherein each of the conductive structures further include an electrically conductive element that is exposed at the first surface of the first interposer and that is electrically connected to one of said first portions.

11. The connection component of claim 6, wherein each planar lead includes a terminal end and a tip end, wherein each of the terminal ends is electrically connected to one of said second portions.

12. The connection component of claim 9, wherein at least one conductive structure further includes an electrically conductive trace that electrically connects the first portion to the second portion of said at least one conductive structure.

13. The connection component of claim 11 further comprising a plurality of joining units, wherein each of the joining units is electrically connected to one of said tip ends.

14. A connection component comprising:
a first interposer having first and second surfaces;
a second interposer having top and bottom surfaces, said top surface being disposed under said second surface, wherein the second interposer is more flexible than the first interposer;
a plurality of conductive structures exposed at the first surface of the first interposer;
a plurality of planar leads exposed at the bottom surface of the second interposer, wherein each of the planar leads is electrically connected to at least one of the conductive structures; and
further comprising:
a third interposer; and
a fourth interposer, wherein the third interposer is disposed over the top surface of the second interposer and the fourth interposer, further wherein the fourth interposer is disposed over the third interposer, further wherein the second surface of the first interposer is disposed over the fourth interposer, and further wherein the second and fourth interposers are more flexible than the first and third interposers.

15. The connection component of claim 14, wherein each of the conductive structures extends through the first, second, third and fourth interposers.

16. The connection component of claim 15, wherein each of the conductive structures includes a first portion that extends through the first interposer and further includes an electrically conductive element that is exposed at the first surface of the first interposer and that is electrically connected to said first portion.

17. The connection component of claim 16, wherein each of the conductive structures further includes a second portion that extends through the second interposer and that is electrically connected to the first portion of said conductive structure and to one of the planar leads.

18. The connection component of claim 17, wherein each of the planar leads includes a terminal end and a tip end.

19. The connection component of claim 18, wherein the terminal end of each planar lead is electrically connected to one of the second portions.

20. The connection component of claim 18 further comprising a plurality of joining units, wherein each of the joining units is electrically connected to one of said tip ends.

21. The connection component of claim 14, wherein the planar leads are curved.

22. A connection component comprising:
a first interposer having first and second surfaces;
a second interposer having top and bottom surfaces, said top surface being disposed under said second surface, wherein the second interposer is more flexible than the first interposer;
a plurality of conductive structures exposed at the first surface of the first interposer; and
a plurality of planar leads exposed at the bottom surface of the second interposer, wherein each of the planar leads is electrically connected to at least one of the conductive structure;
the first interposer comprising a material selected from the group consisting of alumina, beryllia, silicon carbide, aluminum nitride, forsterite, mullite, silicon, glass/ceramic composite, polyester /fiberglass composite, polyimide/fiberglass composite, epoxy/fiberglass composite and BT.

23. A connection component comprising:
a first interposer having first and second surfaces;
a second interposer having top and bottom surfaces, said top surface being disposed under said second surface, wherein the second interposer is more flexible than the first interposer;
a plurality of conductive structures exposed at the first surface of the first interposer; and
a plurality of planar leads exposed at the bottom surface of the second interposer, wherein each of the planar leads is electrically connected to at least one of the conductive structures;
the second interposer comprising polyimide.

24. A connection component comprising:
a first interposer having first and second surfaces;
a second interposer having top and bottom surfaces, said top surface being disposed under the second surface of the first interposer, wherein the second interposer is more flexible than the first interposer; and
a plurality of conductive structures, said conductive structures extending through the first and the second interposers, wherein the conductive structures are exposed at the first surface of the first interposer.

25. A microelectronic component comprising:
a first microelectronic element having a front surface and a plurality of first contacts exposed at the front surface;
a first interposer having first and second surfaces, said first surface being disposed under the first microelectronic element;
a second interposer having top and bottom surfaces, said top surface being disposed under the second surface of the first interposer, wherein the second interposer is more flexible than the first interposer;
a plurality of conductive structures, wherein each of the conductive structures is electrically connected to one of the first contacts; and
a plurality of planar leads exposed at the bottom surface of the second interposer, wherein each of the planar leads is electrically connected to one of the conductive structures.

26. The microelectronic component of claim 25, wherein the second surface of the first interposer is adjacent to the top surface of the second interposer.

27. The microelectronic component of claim 26, wherein the first surface of the first interposer is adjacent to the front surface of the first microelectronic element.

28. A microelectronic component comprising:
a first microelectronic element having a front surface and a plurality of first contacts exposed at the front surface;
a first interposer having first and second surfaces, said first surface being disposed under the first microelectronic element;
a second interposer having top and bottom surfaces, said top surface being disposed under the second surface of the first interposer, wherein the second interposer is more flexible than the first interposer;
a plurality of conductive structures, wherein each of the conductive structures is electrically connected to one of the first contacts; and
a plurality of planar leads exposed at the bottom surface of the second interposer, wherein each of the planar leads is electrically connected to one of the conductive structures;
the second surface of the first interposer being adjacent to the top surface of the second interposer;
the first surface of the first interposer being adjacent to the front surface of the first microelectronic element; and
wherein each of the conductive structures comprises:
a first portion disposed in a first aperture of the first interposer an electrically connected to one of the first contacts; and
a second portion disposed in a second aperture of the second interposer and electrically connected to one of the planar leads.

29. The microelectronic component of claim 28, wherein at least one conductive structure further includes an electrically conductive trace that electrically connects the first portion to the second portion of said at least one conductive structure.

30. The microelectronic component of claim 29, wherein each first portion comprises a conductive polymer, and further wherein each electrically conductive trace and each second portion comprise a metal.

31. The connection component of claim 30, wherein the conductive polymer is conductive adhesive.

32. The microelectronic component of claim 29, wherein each first portion comprises solder, and further wherein each electrically conductive trace and each second portion comprise a metal.

33. The microelectronic component of claim 28, wherein each planar lead includes a terminal end and a tip end, wherein one of the terminal ends is electrically connected to one of the second portions.

34. The microelectronic component of claim 33, wherein the planar leads are curved.

35. The microelectronic component of claim 33, wherein at least one of the tip ends is movable with respect to the first microelectronic element.

36. The microelectronic component of claim 33 further comprising a plurality of joining units, wherein each of the joining units is electrically connected to one of the tip ends.

37. The microelectronic component of claim 36, wherein at least one of the joining units is disposed below the first microelectronic element.

38. The microelectronic component of claim 36, wherein the joining units are solder balls.

39. The microelectronic component of claim 36, wherein at least one joining unit is movable with respect to the first microelectronic element.

40. A microelectronic component comprising:
a first microelectronic element having a front surface and a plurality of first contacts exposed at the front surface;
a first interposer having first and second surfaces, said first surface being disposed under the first microelectronic element;
a second interposer having top and bottom surfaces, said top surface being disposed under the second surface of the first interposer, wherein the second interposer is more flexible than the first interposer;
a plurality of conductive structures, wherein each of the conductive structures is electrically connected to one of the first contacts; and
a plurality of planar leads exposed at the bottom surface of the second interposer, wherein each of the planar leads is electrically connected to one of the conductive structures;
the second surface of the first interposer being adjacent to the top surface of the second interposer;
the first surface of the first interposer including a central region and peripheral region surrounding the central region, further wherein the first microelectronic element is disposed over the central region, and further wherein the front surface of the first microelectronic element faces away from the first surface of the first interposer.

41. The microelectronic component of claim 40, wherein each of the conductive structures includes a first portion that extends through the first interposer and a second portion that extends through the second interposer.

42. The microelectronic component of claim 41, wherein said first and second portions extend through the first and second interposers along a common axis.

43. The microelectronic component of claim 41, wherein said first and second portions extend through the first and second interposers along different axes.

44. The microelectronic component of claim 43, wherein said first and second portions are electrically connected by an electrically conductive trace.

45. The microelectronic component of claim 41, wherein each of the conductive structures further includes an electrically conductive element that is exposed at the first surface of the first interposer and that is electrically connected to one of the first portions.

46. The microelectronic component of claim 45, wherein each of the electrically conductive elements has a bonding terminal that is disposed in the peripheral region of the first surface and that is electrically connected to one of the first contacts by a wirebond.

47. The microelectronic component of claim 46, wherein each wirebond extends downwardly from one of the first contacts to one of the bonding terminals.

48. The microelectronic component of claim 46, wherein the first and second portions, the electrically conductive traces and the electrically conductive elements comprise a metal.

49. The microelectronic component of claim 40, wherein each planar lead includes a terminal end and a tip end, wherein each of the terminal ends is electrically connected to one of the second portions.

50. The microelectronic component of claim 28, wherein the planar leads are curved.

51. The microelectronic component of claim 49, wherein at least one of the tip ends is movable with respect to the first microelectronic element.

52. The microelectronic component of claim 49 further comprising a plurality of joining units, wherein each of the joining units is electrically connected to one of the tip ends.

53. The microelectronic component of claim 52, wherein the joining units are solder balls.

54. The microelectronic component of claim 52, wherein at least one of the joining units is movable with respect to the first microelectronic element.

55. A microelectronic component comprising:
a first microelectronic element having a front surface and a plurality of first contacts exposed at the front surface;
a first interposer having first and second surfaces, said first surface being disposed under the first microelectronic element;
a second interposer having top and bottom surfaces, said top surface being disposed under the second surface of the first interposer, wherein the second interposer is more flexible than the first interposer;
a plurality of conductive structures, wherein each of the conductive structures is electrically connected to one of the first contacts; and
a plurality of planar leads exposed at the bottom surface of the second interposer, wherein each of the planar leads is electrically connected to one of the conductive structures;
the first microelectronic element being a semiconductor chip.

56. A microelectronic component comprising:
a first microelectronic element having a front surface and a plurality of first contacts exposed at the front surface;
a first interposer having first and second surfaces, said first surface being disposed under the first microelectronic element;
a second interposer having top and bottom surfaces, said top surface being disposed under the second surface of the first interposer, wherein the second interposer is more flexible than the first interposer;
a plurality of conductive structures, wherein each of the conductive structures is electrically connected to one of the first contacts; and
a plurality of planar leads exposed at the bottom surface of the second interposer, wherein each of the planar leads is electrically connected to one of the conductive structures;
the first interposer comprising a material selected from the group consisting of alumina, beryllia, silicon carbide, aluminum nitride, forsterite, mullite, silicon, glass/ceramic composite, polyester/fiberglass composite, polyimide/fiberglass composite, epoxy/fiberglass composite and BT.

57. A microelectronic component comprising:
a first microelectronic element having a front surface and a plurality of first contacts exposed at the front surface;
a first interposer having first and second surfaces, said first surface being disposed under the first microelectronic element;
a second interposer having top and bottom surfaces, said top surface being disposed under the second surface of the first interposer, wherein the second interposer is more flexible than the first interposer;
a plurality of conductive structures, wherein each of the conductive structures is electrically connected to one of the first contacts; and
a plurality of planar leads exposed at the bottom surface of the second interposer, wherein each of the planar leads is electrically connected to one of the conductive structures;
the second interposer comprising polyimide.

58. A microelectronic component comprising:
a first microelectronic element having a front surface and a plurality of first contacts exposed at the front surface;
a first interposer having first and second surfaces, said first surface being disposed under the first microelectronic element;
a second interposer having top and bottom surfaces, said top surface being disposed under the second surface of the first interposer, wherein the second interposer is more flexible than the first interposer;
a plurality of conductive structures, wherein each of the conductive structures is electrically connected to one of the first contacts; and
a plurality of planar leads exposed at the bottom surface of the second interposer, wherein each of the planar leads is electrically connected to one of the conductive structures;
the first microelectronic element having a first CTE, and further wherein the first interposer has a second CTE that is substantially similar to the first CTE.

59. A microelectronic component comprising:
a first microelectronic element having a front surface and a plurality of first contacts exposed at the front surface;
a first interposer having first and second surfaces, said first surface being disposed under the first microelectronic element;
a second interposer having top and bottom surfaces, said top surface being disposed under the second surface of the first interposer, wherein the second interposer is more flexible than the first interposer;
a plurality of conductive structures, wherein each of the conductive structures is electrically connected to one of the first contacts;
a plurality of planar leads exposed at the bottom surface of the second interposer, wherein each of the planar leads is electrically connected to one of the conductive structures; and
a second microelectronic element having a face surface and a plurality of second contacts exposed at the face surface, wherein each of the second contacts is electrically connected to one of the conductive structures.

60. The microelectronic component of claim 59, wherein the first surface of the first interposer includes a central region and a peripheral region surrounding the central region, further wherein the front surface of the first microelectronic element is disposed over the central region, further wherein the second microelectronic element is disposed over a rear surface of the first microelectronic element, and further wherein the face surface faces away from the first microelectronic element.

61. The microelectronic component of claim 59, wherein the second microelectronic element is a semiconductor chip.

62. The microelectronic component of claim 60, wherein the front surface of the first microelectronic element is adjacent to the central region, and further wherein the second microelectronic element is adhered to the rear surface of the first microelectronic element.

63. The microelectronic component of claim 62, wherein each of the first contacts is directly connected to one of the conductive structures, and further wherein each of the second contacts is electrically connected to one of the conductive structures by a wirebond.

64. The microelectronic component of claim 63, wherein some of the conductive structures comprise:
  a first portion disposed in a first aperture of the first interposer and electrically connected to one of the first contacts, said first portion being disposed in the central region of the first interposer; and
  a second portion disposed in a second aperture of the second interposer and electrically connected to one of the planar leads.

65. The microelectronic component of claim 64, wherein said some of the conductive structures include an electrically conductive trace that electrically connects the first portion of the conductive structure to the second portion of said conductive structure.

66. The microelectronic component of claim 65, wherein the first portions comprise a conductive polymer, and further wherein the electrically conductive traces and the second portions comprise a metal.

67. The microelectronic component of claim 65, wherein the first portion comprise solder, and further wherein the electrically conductive traces and the second portions comprise a metal.

68. The microelectronic component of claim 63, wherein some of the conductive structures further comprise an electrically conductive element exposed at the first surface of the first interposer, said electrically conductive element having a bonding terminal exposed in the peripheral region of the first interposer and electrically connected to the wirebond.

69. The microelectronic component of claim 68, wherein said some of the conductive structures comprise a metal.

70. An electronic device comprising:
  a microelectronic element having a front surface and a plurality of contacts exposed at the front surface;
  a first interposer having first and second surfaces, said first surface being disposed under the microelectronic element;
  a second interposer having top and bottom surfaces, said top surface being disposed under the second surface of the first interposer, wherein the second interposer is more flexible than the first interposer;
  a plurality of conductive structures, wherein each of the conductive structures is electrically connected to one of the contacts; and
  a plurality of planar leads exposed at the bottom surface of the second interposer, wherein each of the planar leads is electrically connected to one of the conductive structures;
  a plurality of joining units disposed at the bottom surface of the second interposer, wherein each of the joining units is electrically connected to one of the planar leads; and
  a support substrate having a plurality of electrically conductive contact pads, wherein each of the pads is electrically connected to one of the joining units.

71. The electronic device of claim 70, wherein the support substrate is a printed circuit board.

72. The electronic device of claim 71, wherein the conductive structures extend through the first and second interposers.

73. The microelectronic element of claim 70, wherein at least one of the joining units is disposed below the microelectronic element.

* * * * *

UNITED STATES PATENT AND TRADEMARK OFFICE
CERTIFICATE OF CORRECTION

PATENT NO.  : 6,573,609 B2
DATED       : June 3, 2003
INVENTOR(S) : Joseph Fjelstad and John Myers It is certified that error appears in the above-identified patent and that said Letters Patent is hereby corrected as shown below:

<u>Title page, Item [54] and Column 1, line 1,</u>
Title, "MICROELECTRIC COMPONENT WITH RIGID INTERPOSER" should read -- MICROELECTRONICS COMPONENT WITH RIGID INTERPOSER --.

<u>Column 23,</u>
Line 16, "at east" should read -- at least --.
Line 21, "that extend" should read -- that extends --.

<u>Column 24,</u>
Line 42, "conductive structure" should read -- conductive structures --.

Signed and Sealed this

Seventh Day of October, 2003

JAMES E. ROGAN
*Director of the United States Patent and Trademark Office*